United States Patent [19]
Heitzmann et al.

[11] Patent Number: 5,354,711
[45] Date of Patent: Oct. 11, 1994

[54] PROCESS FOR ETCHING AND DEPOSITING INTEGRATED CIRCUIT INTERCONNECTIONS AND CONTACTS

[75] Inventors: Michel Heitzmann, Crolles; Jean Lajzerowicz, Meylan; Philippe LaPorte, Sassenage, all of France

[73] Assignee: Commissariat A l'Energie Atomique, Paris, France

[21] Appl. No.: 89,408

[22] Filed: Jul. 8, 1993

Related U.S. Application Data

[63] Continuation of Ser. No. 717,033, Jun. 18, 1991, abandoned.

[30] Foreign Application Priority Data

Jun. 26, 1990 [FR]  France .............................. 90 08011

[51] Int. Cl.⁵ .................... H01L 21/283; H01L 21/90
[52] U.S. Cl. .................. 437/182; 437/195; 437/203; 156/651
[58] Field of Search ......................... 437/195

[56] References Cited

FOREIGN PATENT DOCUMENTS

| | | |
|---|---|---|
| 0224013 | 10/1986 | European Pat. Off. . |
| 0288802 | 11/1988 | European Pat. Off. . |
| 61-96729 | 5/1986 | Japan .................................. 437/203 |
| 1191443 | 8/1989 | Japan .................................. 437/203 |

OTHER PUBLICATIONS

IBM Technical Disclosure Bulletin 29 (1986) Aug. No. 3, New York, Integrated Circuit Conductor Line Self-Aligned to Contact Opening.

*Primary Examiner*—Robert Kunemund
*Assistant Examiner*—David E. Graybill
*Attorney, Agent, or Firm*—Hayes, Soloway, Hennessey, Grossman & Hage

[57] ABSTRACT

Process for producing an integrated circuit stage formed from a dielectric layer (1) covering interconnection lines (5) and connection points (4), which connect the said lines (5) to conductive parts (6) on the opposite side of the dielectric layer (1). The process consists of forming all the dielectric layer (1) during a single step and then successively etching cavities at the locations of the connection points and the interconnection lines by means of two successively positioned masks and then filling the cavities in a single step with conductive material in order to simultaneously form connection points (4) and interconnection lines (5).

2 Claims, 2 Drawing Sheets

PROCESS FOR ETCHING AND DEPOSITING INTEGRATED CIRCUIT INTERCONNECTIONS AND CONTACTS

This is a continuation Ser. No. 07/717,033 filed on Jun. 18, 1991, now abandoned.

BACKGROUND OF THE INVENTION

Field Of The Invention

The invention relates to a process for producing an integrated circuit stage, which is constituted by interconnection lines and connection points, which connect the interconnection lines to conductive parts of the integrated circuit positioned beneath the stage. A dielectric material layer fills the volumes not occupied by the connection points and lines.

Description Of The Related Art

FIG. 1 shows such an integrated circuit stage and the steps of a known process for its production are illustrated by FIGS. 2A and 2B.

The dielectric layer 1 can be broken down into two superimposed sublayers 2 and 3, such that the connection points 4 extend in the lower sublayer 2 and the interconnection lines 5 in the upper sublayer 3. The connection points 4 connect the interconnection lines 5 to conductive parts of the integrated circuit, which can in particular be source, drain or gate regions 6 located below the dielectric layer 1.

The conventional process firstly consists of depositing the lower sublayer 2 and then above it a continuous resin layer 7. This is followed by lithography of the resin layer 7 in order to form cavities 8 at positions above the connection points 5, so as to produce a mask. It is then possible to etch the lower sublayer 2 to form the cavities 9 at the locations of the connection points 4. This gives the state shown in FIG. 2A. After removing the mask, conductive material is deposited on the lower sublayer 2, so as to fill the cavities 9 and thus create connection points 4 and an upper conductive layer 10, which covers the lower sublayer 2. Finally, etching of the upper conductive layer 10 ensures that only the interconnection lines 5 thereof are left behind. This state is shown in FIG. 2B. The gaps between the interconnection lines 5 are then filled with a dielectric deposit in order to constitute the upper sublayer 3. If necessary, the interconnection lines 5 are covered by a not shown passivation layer.

The fundamental disadvantage of this procedure is that the covering layer 10 cannot be perfectly planar and has hollows above the connection points 4. If the cavities 9 have a high shape or form factor (depth/diameter ratio), the hollowing is such that it is not possible to obtain with certainty interconnection lines 5 able to satisfactorily transmit electricity. Therefore this process limits the integration density of the circuit by making it impossible to reduce the width of the interconnection lines 5 and the diameter of the connection points 4 by the amount which would be desired.

Numerous variants of this process have been proposed for obviating these disadvantages. Thus, for forming connection points 4 and interconnection lines 5, it has been proposed that certain materials should be used which are appropriate for deposits, whose upper surface is automatically planar and more particularly tungsten or polycrystalline silicon by chemical vapour phase deposition, but the conductivity of these materials is low and it is consequently necessary to use thicker interconnection lines 5. After producing the covering layer 10 with these processes, it has also been proposed to eliminate said layer completely by etching, so as to only leave behind the connection points 4. This is followed by the deposition of the upper sublayer 3, its etching at the locations of the interconnection lines 5 and finally the deposition of a conductive metal, such as aluminium, so as to cover the etched upper sublayer 3. It is then easy to eliminate the aluminium above the upper sublayer 3 in order to obtain the state of FIG. 1. However, it is clear that it is disadvantageous to have to deposit the conductive material in two operations.

SUMMARY OF THE INVENTION

The procedure according to the invention essentially makes it possible to obtain an integrated circuit stage having no excessive relief and whose production only involves a single conductive material deposition.

The process is characterized by the following succession of steps:

deposition of a continuous layer forming the dielectric layer (i.e. the sublayers 2 and 3 are deposited in this step);

at least partial etching of the dielectric layer at the locations of the connection points after producing a first mask on the dielectric layer;

final etching of the dielectric layer at the locations of the connection points and the upper sublayer at the locations of the interconnection lines after producing a second mask on the dielectric layer;

deposition of a conductive material on the dielectric layer so as to fill the etched portions and thus form the connection points and interconnection lines; and elimination of the conductive material above the dielectric layer.

A preferred embodiment consists of providing a first mask incorporating a directly covering layer on the dielectric layer. The second mask is then produced on the covering layer prior to commencing the etching of the dielectric layer at the locations of the connecting points. The surface on which the second mask is produced is then almost planar.

As has been seen, the conductive material can be chosen in such a way that it is suitable for automatically forming an upper planar surface when it is deposited.

DETAILED DESCRIPTION OF THE PREFERRED EMBODIMENT

A more detailed description will now be given of a possible embodiment of the process with the aid of FIGS. 3A to 3K.

Figure 3A:
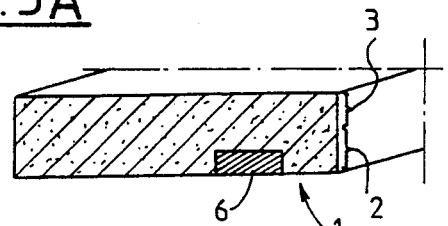
FIGS. 3A–3K depict process steps according to the instant invention for fabricating the stage shown in FIG. 1.

Formation firstly takes place of the two continuous sublayers 2 and 3 forming the dielectric layer 1 by the deposition on the gates 6 or the lower conductive portions of a silicon oxide layer enriched with boro-phospho-silicate glass with a total thickness of 1.5 micrometers and which is then annealed to make it planar, which gives the state shown in FIG. 3A.

Figure 3B:
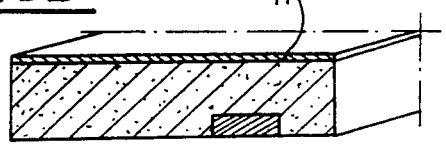

A covering layer 11, which can be of polycrystalline silicon and having a thickness of 200 nanometers is then deposited on the upper sublayer 3 (FIG. 3B).

Figure 3C:
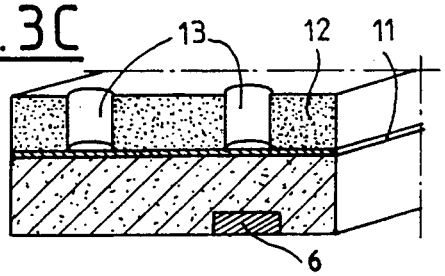
Figure 3D:
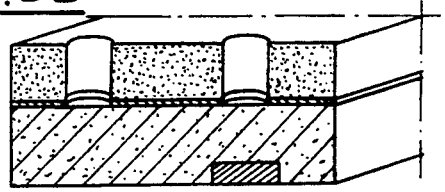

A continuous resin layer 12 is then deposited on the covering layer 11 and undergoes lithography, which hollows out cavities 13 above the locations of the connecting points 4 and until the covering layer 11 is reached (FIG. 3C).

Figure 3E:
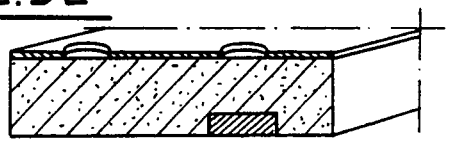
Figure 3F:
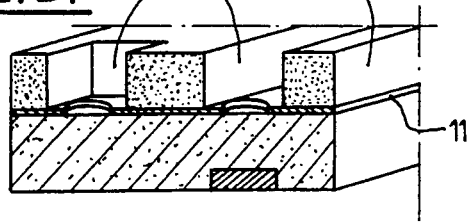

The following step consists of etching the covering layer 11 at the locations of the cavities 13 (FIG. 3D), after which the resin layer 12 is eliminated (FIG. 3E).

It is then possible (FIG. 3F) to form on the covering layer 11 a second resin layer 14 which, after having been deposited, undergoes lithography in such a way as to form cavities 15 on the locations of the interconnection lines 5 which will soon be formed.

Figure 3G:
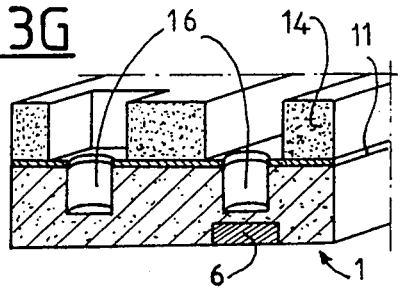
Figure 3H:
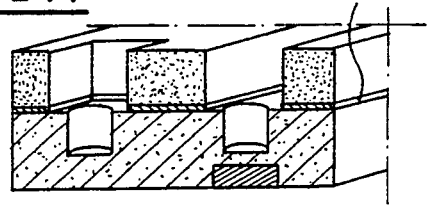
Figure 3I:
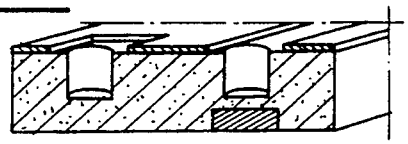
Figure 3J:
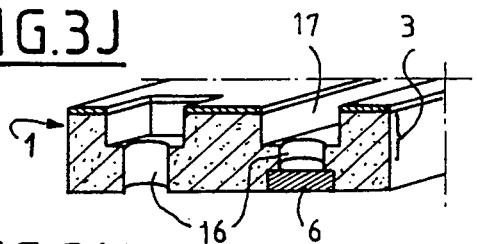

The following step, shown in FIG. 3G, consists of etching the dielectric layer 1 at the locations of the interconnection points 4 and over a partial depth of approximately 700 nanometers in an exemplified manner, in order to create there the cavities 16. The covering layer 11 serves as the first mask by protecting the dielectric layer areas 1 which it covers. After this, a further etching can be carried out utilizing the second resin layer 14 as the second mask in order to eliminate the covering layer 11 (FIG. 3H) at the location of the interconnection lines 5. The second resin layer 14 is then removed (FIG. 3I), after which a further etching is carried out in order to create in the upper sublayer 3 of the dielectric layer 1 cavities 17 at the locations of the interconnection lines 5, while deepening the cavities 16 until the conductive portions are reached below the dielectric layer 1 and which are to be connected (FIG. 3J). The steps leading to FIGS. 3I and 3J can also be reversed.

Figure 3K:
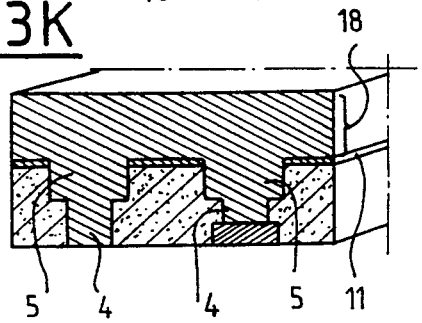

FIG. 3K shows the state of the integrated circuit after depositing a conductive material for forming the connection points 4 and the interconnection lines 5 on the dielectric sublayers 2, 3 and the covering layer 11. The conductive material fills the cavities 16 and 17 in order to form the connection points 4 and the interconnection lines 5 and it is deposited above the interconnection lines 5 and the covering layer 11 in order to form an upper conductive layer 18. This layer is planar in certain cases, particularly in the case of depositing tungsten or polycrystalline silicon by chemical vapour phase deposition.

Figure 1:
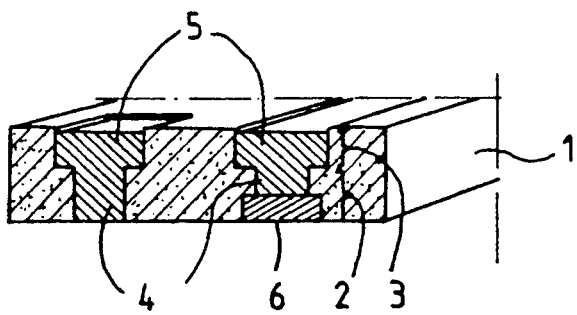
FIG. 1 shows an integrated circuit stage.
Figure 2A:
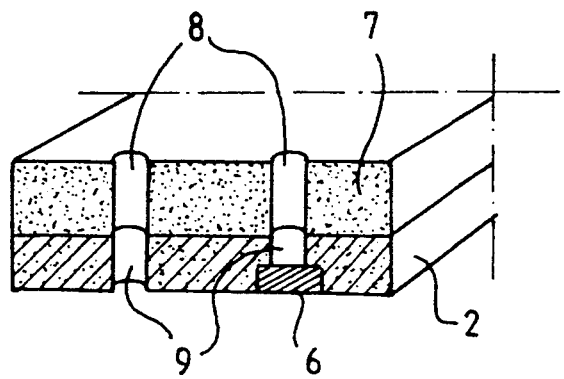
FIGS. 2A–2B depict prior art process steps for producing the integrated circuit stage shown in FIG. 1.
Figure 2B:
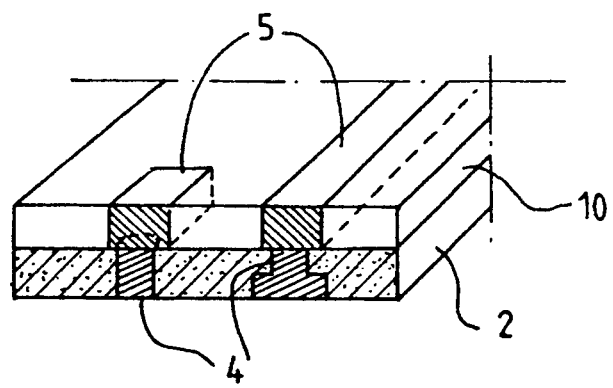

The final step consists of uniformly or "whole plate" etching of the upper conductive layer 18 in order to entirely eliminate it and arrive at the end product shown in FIG. 1.

A simplified variant of the process consists of using as the first mask the resin layer 12 only, while obviating the covering layer 11. After hollowing the cavities 13, immediately mid-depth etching takes place of the cavities 16 and after this the resin layer 12 is removed in order to replace it by the second resin layer 14. This is followed by the steps of forming cavities 15 and the steps leading to FIGS. 3H to 3K. However, it is less easy to produce the second resin layer 14, because the resin penetrates the cavities 16, which under these conditions would compromise the planarity of the layer.

The process according to the invention can be performed with conventional materials and deposition, etching and similar processes. The thus produced integrated circuit can advantageously be a random access semiconductor memory or an electrical programming read only memory and in general terms any integrated circuit, whose integration density is limited by existing technologies, particularly those whose characteristic dimensions are below 1 micrometer.

We claim:

1. A process for producing an integrated circuit stage having a dielectric layer covering interconnection lines and connection points linking the interconnection lines to conductive portions of the integrated circuit positioned below the dielectric layer, the latter having a lower sublayer covering the connection points and an upper sublayer covering the interconnection lines, said process comprising the following steps in sequence of:
   depositing the dielectric layer;
   at least partially etching the dielectric layer at the locations of the connection points after producing a first mask on the dielectric layer;
   final etching of the dielectric layer at the locations of the connection points and the upper sublayer at the locations of the interconnection lines after producing a second mask on the dielectric layer;
   once depositing a conductive material on the dielectric layer, so as to: (i) fill the etched portions to contemporaneously form the connection points and interconnection lines, and (ii) produce an upper conductive layer above the dielectric layer, said upper conductive layer forming a planar upper surface, said conductive material being suitable for formation of said planar surface; and,
   eliminating the conductive material above the dielectric layer to form a final planar layer comprising the interconnection lines and the dielectric.

2. A process according to claim 1, wherein the first mask comprises a covering layer produced on the dielectric layer and the second mask is produced in the covering layer before starting the etching of the dielectric layer at the locations of the connection points.

* * * * *

UNITED STATES PATENT AND TRADEMARK OFFICE
CERTIFICATE OF CORRECTION

PATENT NO. : 5,354,711

DATED : OCTOBER 11, 1994

INVENTOR(S) : HEITZMANN ET AL

It is certified that error appears in the above-identified patent and that said Letters Patent is hereby corrected as shown below:

CLAIM 1, COL. 4, LINE 47, "UPPER" SHOULD BE INSERTED BEFORE --LAYER--. (second occurrence)

Signed and Sealed this

Third Day of January, 1995

Attest:

BRUCE LEHMAN

Attesting Officer

Commissioner of Patents and Trademarks